United States Patent
Del Castillo et al.

(10) Patent No.: US 10,663,142 B2
(45) Date of Patent: May 26, 2020

(54) LIGHT-EMITTING DEVICE WITH REFLECTIVE CERAMIC SUBSTRATE

(71) Applicant: BRIDGELUX, INC., Livermore, CA (US)

(72) Inventors: Jesus Del Castillo, Palo Alto, CA (US); Scott West, Pleasanton, CA (US); Vladimir Odnoblyudov, Danville, CA (US)

(73) Assignee: BRIDGELUX INC., Fremont, CA (US)

( * ) Notice: Subject to any disclaimer, the term of this patent is extended or adjusted under 35 U.S.C. 154(b) by 129 days.

(21) Appl. No.: 14/231,657

(22) Filed: Mar. 31, 2014

(65) Prior Publication Data

US 2015/0276172 A1    Oct. 1, 2015

(51) Int. Cl.

| | | |
|---|---|---|
| *F21K 9/64* | (2016.01) | |
| *F21V 7/00* | (2006.01) | |
| *F21V 23/00* | (2015.01) | |
| *F21V 29/503* | (2015.01) | |
| *F21V 9/30* | (2018.01) | |

(Continued)

(52) U.S. Cl.
CPC .............. *F21V 7/0066* (2013.01); *F21K 9/60* (2016.08); *F21K 9/64* (2016.08); *F21V 9/30* (2018.02); *F21V 23/003* (2013.01); *F21V 29/503* (2015.01); *F21Y 2115/10* (2016.08); *H01L 2224/48091* (2013.01); *H01L 2224/48137* (2013.01)

(58) Field of Classification Search
CPC ........ F21V 7/0066; F21V 9/16; F21V 23/003; F21V 29/503; F21V 9/30; F21Y 2101/02; F21Y 2115/10; F21K 9/50; F21K 9/60; F21K 9/64; H01L 2224/48137; H01L 2224/48091

See application file for complete search history.

(56) References Cited

U.S. PATENT DOCUMENTS

| | | | | |
|---|---|---|---|---|
| 2004/0000727 A1* | 1/2004 | Hsu | ........................ | H01L 33/486 257/787 |
| 2006/0022211 A1* | 2/2006 | Yatsuda | .............. | H01L 25/0753 257/98 |

(Continued)

*Primary Examiner* — Anh T Mai
*Assistant Examiner* — Fatima N Farokhrooz
(74) *Attorney, Agent, or Firm* — Arent Fox LLP

(57) ABSTRACT

A light-emitting device may include a ceramic substrate having a reflective component, a light-emitting diode on the ceramic substrate, and a light-converting material over the light-emitting diode. A lighting system may include a ceramic substrate having a reflective component, a plurality of light-emitting diodes connected together in series, wherein the plurality of light-emitting diodes are on the ceramic substrate, and a light-converting material over the plurality of light-emitting diodes. The ceramic substrate may provide electrical insulation between the light-emitting diode and the aluminum carrier. The ceramic substrate may provide thermal conductivity between the light-emitting diode and the aluminum carrier. The reflective component may include zirconium oxide. The ceramic substrate may include aluminum oxide and/or aluminum nitride. The light-converting material may include phosphor. The light-emitting diode may have an epitaxial diode structure.

18 Claims, 4 Drawing Sheets

(51) Int. Cl.
*F21K 9/60* (2016.01)
*F21Y 115/10* (2016.01)

(56) References Cited

U.S. PATENT DOCUMENTS

| | | | | |
|---|---|---|---|---|
| 2007/0013293 A1* | 1/2007 | Cok | ................... | B82Y 20/00 |
| | | | | 313/504 |
| 2008/0278063 A1* | 11/2008 | Cok | ................... | B82Y 20/00 |
| | | | | 313/500 |
| 2010/0019247 A1* | 1/2010 | Joichi | ................... | H01L 33/32 |
| | | | | 257/76 |
| 2010/0133557 A1* | 6/2010 | Kwon | ................... | H01L 31/024 |
| | | | | 257/88 |
| 2011/0248302 A1* | 10/2011 | Choi | ................... | H01L 27/15 |
| | | | | 257/98 |
| 2013/0077313 A1* | 3/2013 | Chen | ................... | F21V 3/04 |
| | | | | 362/249.02 |
| 2013/0181593 A1* | 7/2013 | Shikata | ................ | G02B 5/0284 |
| | | | | 313/46 |
| 2013/0200406 A1* | 8/2013 | Hussell | ................ | H01L 33/486 |
| | | | | 257/88 |
| 2014/0091329 A1* | 4/2014 | Lee | ................... | F21K 9/00 |
| | | | | 257/88 |
| 2014/0264611 A1* | 9/2014 | Lee | ................... | H01L 24/80 |
| | | | | 257/368 |
| 2014/0268728 A1* | 9/2014 | Hussell | ................ | F21K 9/90 |
| | | | | 362/225 |
| 2015/0115458 A1* | 4/2015 | Palm | ................... | H01L 24/31 |
| | | | | 257/774 |
| 2015/0115475 A1* | 4/2015 | Palm | ................... | H01L 24/06 |
| | | | | 257/777 |
| 2015/0124455 A1* | 5/2015 | Tamura | ................ | F21K 9/56 |
| | | | | 362/293 |
| 2015/0282260 A1* | 10/2015 | Hussell | ............ | H05B 33/0806 |
| | | | | 315/51 |

* cited by examiner

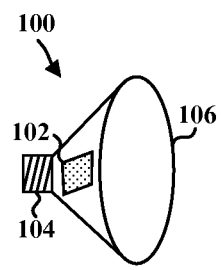
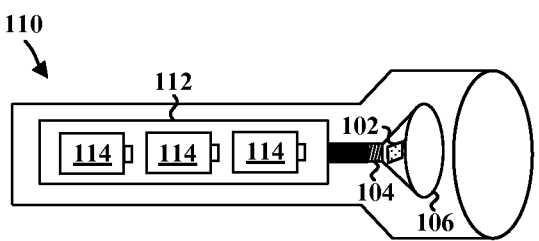
FIG. 1A
FIG. 1B
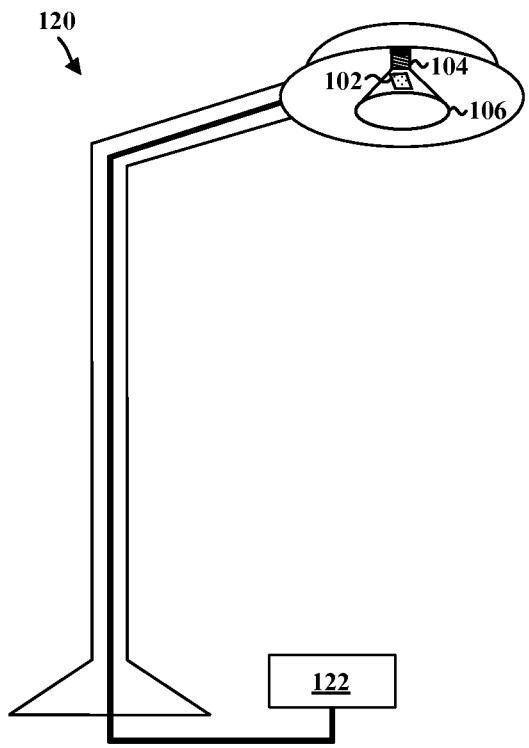
FIG. 1C

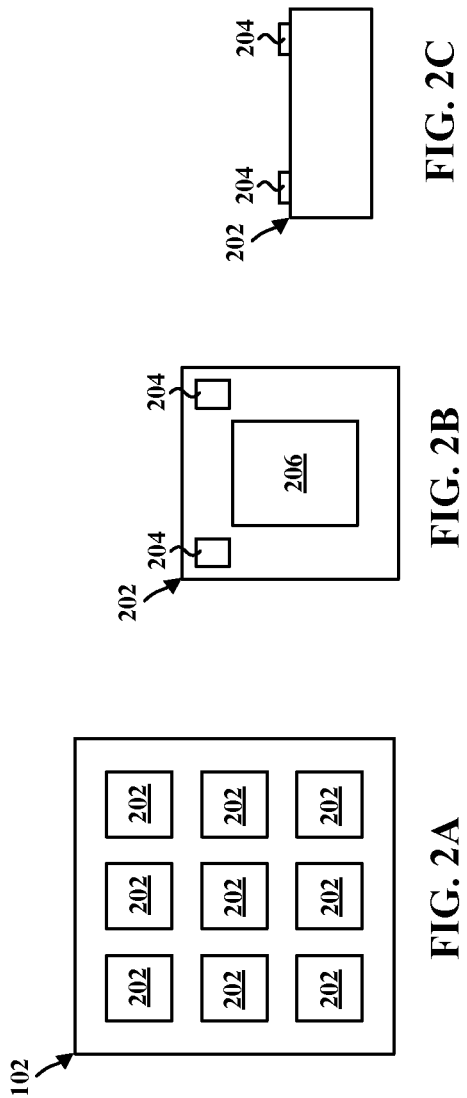

LIGHT-EMITTING DEVICE WITH REFLECTIVE CERAMIC SUBSTRATE

BACKGROUND

Field

The present disclosure relates generally to a light-emitting device and, more particularly, to a light-emitting device with a reflective ceramic substrate.

Background

A light-emitting device may include a substrate located between light-emitting diodes and a heat sink. Different substrates may have different thermal conductivities, different electrical conductivities, and/or different conversion efficiencies. A substrate with low thermal conductivity may transfer relatively less heat from the light-emitting diodes to the heat sink, thereby causing the light-emitting diodes to overheat. A substrate with high electrical conductivity may allow relatively more power to escape through the substrate, thereby decreasing power efficiency of the light-emitting device. A substrate with low conversion efficiency may have relatively high light-absorption, thereby decreasing the total emission of light from the light-emitting device.

In existing systems, the substrate may include sapphire or silicon. However, sapphire has low thermal conductivity, and silicon has high electrical conductivity and low conversion efficiency. Although an electrical insulator may be added between a silicon substrate and the heat sink in order to reduce electrical conductivity, providing such an additional layer adds manufacturing steps and production costs. Therefore, a need exists for a substrate that has high thermal conductivity, dielectric properties, and high conversion efficiency, without requiring additional manufacturing steps.

SUMMARY

Several aspects of the present invention will be described more fully hereinafter with reference to various apparatuses.

One aspect of a light-emitting device is disclosed. A light-emitting device may include a ceramic substrate having a reflective component, a light-emitting diode on the ceramic substrate, and a light-converting material over the light-emitting diode.

One aspect of a lighting system is disclosed. A lighting system may include a ceramic substrate having a reflective component, a plurality of light-emitting diodes connected together in series, wherein the plurality of light-emitting diodes are on the ceramic substrate, and a light-converting material over the plurality of light-emitting diodes.

It is understood that other aspects of apparatuses will become readily apparent to those skilled in the art from the following detailed description, wherein various aspects of apparatuses and methods are shown and described by way of illustration. As understood by one of ordinary skill in the art, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

Various aspects of apparatuses will now be presented in the detailed description by way of example, and not by way of limitation, with reference to the accompanying drawings, wherein:

FIGS. 1A-1C are side view illustrations of various exemplary apparatuses having a light-emitting device.

FIG. 2A is a top view illustration of an exemplary embodiment of a light-emitting device.

FIGS. 2B and 2C are top and side view illustrations of an exemplary embodiment of a light-emitting diode.

DETAILED DESCRIPTION

Figure 3A:
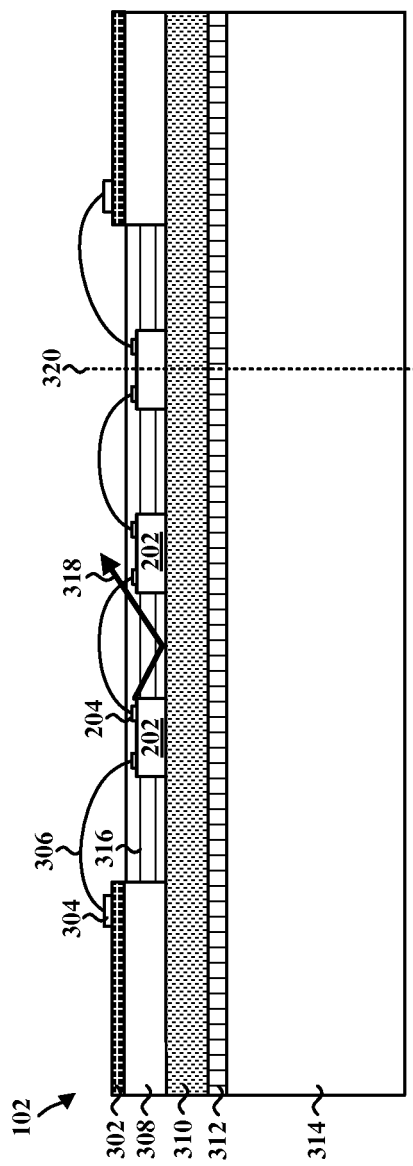
FIG. 3A is a side view illustration of another exemplary embodiment of a light-emitting device.

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention. Acronyms and other descriptive terminology may be used merely for convenience and clarity and are not intended to limit the scope of the invention.

The word "exemplary" is used herein to mean serving as an example, instance, or illustration. Any embodiment described herein as "exemplary" is not necessarily to be construed as preferred or advantageous over other embodiments. Likewise, the term "embodiment" of an apparatus, method or article of manufacture does not require that all embodiments of the invention include the described components, structure, features, functionality, processes, advantages, benefits, or modes of operation.

The various aspects of the present invention illustrated in the drawings may not be drawn to scale. Rather, the dimensions of the various features may be expanded or reduced for clarity. In addition, some of the drawings may be simplified for clarity. Thus, the drawings may not depict all of the components of a given apparatus or method. Various aspects of the present invention will be described herein with reference to drawings that are schematic illustrations of idealized configurations of the present invention. As such, variations from the shapes of the illustrations as a result, for example, manufacturing techniques and/or tolerances, are to be expected. Thus, the various aspects of the present invention presented throughout this disclosure should not be construed as limited to the particular shapes of elements (e.g., regions, layers, sections, substrates, bulb shapes, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of the present invention.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" on another element, it can be grown, deposited, etched, attached, connected, coupled, or otherwise prepared or fabricated on the other element or an intervening element.

It will be further understood that the terms "comprises" and/or "comprising," when used in this specification, specify the presence of stated features, steps, operations, elements, and/or components, but do not preclude the presence or addition of one or more other features, integers, steps, operations, elements, components, and/or groups thereof. The term "and/or" includes any and all combinations of one or more of the associated listed items.

Unless otherwise defined, all terms (including technical and scientific terms) used herein have the same meaning as commonly understood by a person having ordinary skill in the art to which this invention belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

In the following detailed description, various aspects of the present invention will be presented in the context of a light-emitting device. However, those skilled in the art will realize that these aspects may be extended to other apparatus and/or their features, operations, elements, and/or components. Accordingly, any reference to a light-emitting device is intended only to illustrate the various aspects of the present invention, with the understanding that such aspects may have a wide range of applications.

Applicant hereby incorporates by reference the disclosure previously provided in U.S. patent application Ser. No. 12/705,240, filed on Feb. 12, 2010, which is now U.S. Pat. No. 8,371,718.

FIG. 1A is a side view illustration of an exemplary apparatus 100 having a light-emitting device 102. The light-emitting device 102 may be located in a housing 106. The light-emitting device 102 may receive power via a power connection 104. The light-emitting device 102 may be configured to emit light. Description pertaining to the process by which light is emitted by the light-emitting device 102 is provided infra with reference to FIGS. 2A-2C.

FIG. 1B is a side view illustration of a flashlight 110, which is an exemplary embodiment of an apparatus having the light-emitting device 102. The light-emitting device 102 may be located inside of the housing 106. The flashlight 110 may include a power source. In some exemplary embodiments, the power source may include batteries 114 located inside of a battery enclosure 112. The power connection 104 may transfer power from the power source (e.g., the batteries 114) to the light-emitting device 102.

FIG. 1C is a side view illustration of a street light 120, which is another exemplary embodiment of an apparatus having the light-emitting device 102. The light-emitting device 102 may be located inside of the housing 106. The street light 120 may include a power source. In some exemplary embodiments, the power source may include a power generator 122. The power connection 104 may transfer power from the power source (e.g., the power generator 122) to the light-emitting device 102.

FIG. 2A is a top view illustration of an exemplary embodiment of the light-emitting device 102. The light-emitting device 102 may have one or more light-emitting diodes 202. In some exemplary embodiments, the light-emitting diodes 202 may have an epitaxial diode structure. The light-emitting diodes 202 may be configured in various arrays. Although FIG. 2A illustrates an example array with three rows and three columns, one of ordinary skill in the art will appreciate that alternative arrays may have fewer or greater numbers of rows and/or columns without deviating from the scope of the present disclosure. One of ordinary skill in the art will also appreciate that the distance separating the light-emitting diodes 202 may be uniform or non-uniform without deviating from the scope of the present disclosure.

FIG. 2B is a top view illustration of the exemplary embodiment of the light-emitting diode 202 shown in FIG. 2A. FIG. 2C is a side view illustration of the exemplary embodiment of the light-emitting diode 202 shown in FIG. 2A. The light-emitting diode 202 may include contacts 204. The contacts 204 may be configured to receive power from a driver that is electrically connected to a power source (e.g., batteries 114 in FIG. 1B and/or power generator 122 in FIG. 1C). The driver can include circuitry that converts AC-to-DC power, converts DC-to-DC power, regulates current, provides power to other electronic components, provides power to generate light in the LED, etc. The contacts 204 may provide power to the area 206.

The area 206 includes an n-type semiconductor region and a p-type semiconductor region. The n-type semiconductor region is predominated by electrons. The p-type semiconductor region is predominated by holes. During operation of the light-emitting diode 202, a reverse electric field is created at the junction between the n-type semiconductor region and the p-type semiconductor region (sometimes referred to herein as the "p-n junction"). The reverse electric field causes the electrons and holes to move away from the p-n junction, thereby forming an active region. When forward voltage sufficient to overcome the reverse electric field is applied across the p-n junction, electrons and holes are forced into the active region and are combined together. When electrons combine with holes, the particles fall to lower energy levels. Falling to lower energy levels causes energy to be released, and the energy released may be in the form of emitted light. Accordingly, power applied to the contacts 204 can cause light to be emitted by the light-emitting diode 202.

FIG. 3A is a side view illustration of an exemplary embodiment of the light-emitting device 102, which may include one or more light-emitting diodes 202. The light-emitting device 102 may have contacts 204 that receive power. In some configurations, power may be transferred to the light-emitting diodes 202 via electrical traces 306. The electrical traces 306 may connect a light-emitting diode 202 to a power source 304. The electrical traces 306 may also connect a light-emitting diode 202 to another light-emitting diode 202. In some configurations, an electrical insulator 302 may separate the power source 304 from other portions of the light-emitting device 102. In some configurations, a bonded pad 308 may separate the electrical insulator 302 from the ceramic substrate 310. A die attach material 312 may secure the ceramic substrate 310 to an aluminum carrier 314. The aluminum carrier 314 may be a heat sink (e.g., an element that absorbs heat).

The light-emitting diodes 202 may be positioned on top of the ceramic substrate 310. The ceramic substrate 310 may include various materials. In some exemplary embodiments, the ceramic substrate 310 may include silicon (Si). Silicon provides thermal conductivity of approximately 150 W/mK. Accordingly, silicon provides good thermal conductivity. In some exemplary embodiments, the ceramic substrate 310 may include aluminum nitride (AlN). Aluminum nitride provides thermal conductivity of approximately 285 W/mK. Accordingly, aluminum nitride also provides good thermal conductivity. Also, aluminum nitride may provide a band gap (also known as an 'energy gap') of approximately 6.2 eV. Accordingly, aluminum nitride has low conductivity efficiency and therefore low electrical conductivity. In some exemplary embodiments, the ceramic substrate 310 may include aluminum oxide ($Al_2O_3$).

The foregoing embodiments provide non-limiting examples of materials that may be provided in the ceramic substrate 310 to provide (1) high thermal conductivity and/or (2) low electrical conductivity. High thermal conductivity provides for high rates of heat transfer through the ceramic substrate 310 and, therefore, away from the light-emitting diodes 202. Transfer of heat away from the light-emitting diodes 202 prevents over-heating of the light-emitting diodes 202. Over-heating of the light-emitting diodes 202 may increase the temperature at the p-n junction and thereby decrease the overall performance of the light-emitting diodes 202. Accordingly, the ceramic substrate 310 may provide at least some thermal conductivity between at least one light-emitting diode 202 and the aluminum carrier 314.

Low electrical conductivity prevents power from escaping through the ceramic substrate 310. Power escaping through the ceramic substrate 310 may require additional power to be provided to other light-emitting diodes 202 connected in series, thereby reducing power efficiency of the overall light-emitting device 102. Accordingly, the ceramic substrate 310 may provide at least some electrical insulation between at least one light-emitting diode 202 and the aluminum carrier 314.

The ceramic substrate 310 may also include a reflective component. In some exemplary embodiments, the reflective component includes zirconium oxide ($ZrO_2$). The reflective component (e.g., zirconium oxide) may be infused throughout the ceramic substrate 310. The reflective component may increase the reflective properties of the ceramic substrate 310. Generally, reflectivity refers to the degree to which a material reflects light emitted onto it. The reflectivity of a material may be measured according to a reflectivity index or a percentage of light that reflects when light is emitted onto it. For example, a percent reflectivity of the ceramic substrate 310 having the reflective component may be at least 70%.

The foregoing embodiments provide non-limiting examples of materials that may be provided in the ceramic substrate 310 to provide high reflectivity of light. In FIG. 3A, a beam of light is illustrated with arrow 318. The beam of light (e.g., arrow 318) is emitted by a light-emitting diode 202. Some of the emitted light travels in the direction of the ceramic substrate 310. Based on the reflectivity of the ceramic substrate 310, a percentage of the light emitted onto the ceramic substrate 310 will be reflected away from the ceramic substrate 310 and a percentage of the light emitted onto the ceramic substrate 310 will be absorbed by the ceramic substrate 310. High reflectivity of light corresponds to low absorption of light (also known as "self-absorption") by the ceramic substrate 310. High reflectivity of light also corresponds to high conversion efficiency (e.g., a high ratio of the light output by the light-emitting device 102 relative to the power consumed by the light-emitting device 102). Overall, high reflectivity of light contributes to improved light output by the light-emitting device 102.

A light-converting material 316 may be provided on the ceramic substrate 310 and/or the light-emitting diodes 202. When light emitted by the light-emitting diodes 202 passes through the light-converting material 316, the color of the light may change. In some embodiments, the light-converting material 316 is phosphor. For example, a layer of phosphor may be provided over the light-emitting diodes 202.

Figure 3B:
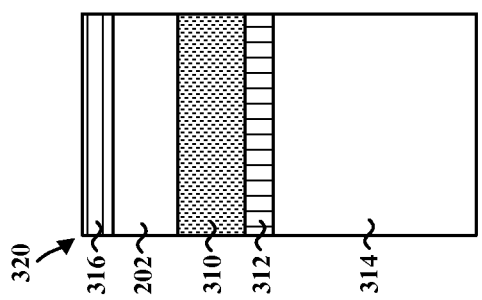
FIG. 3B is a cross-section illustration of the exemplary light-emitting device shown in FIG. 3A.

FIG. 3B is a cross-section illustration of the light-emitting device 102. More specifically, FIG. 3B illustrates the cross-section taken at location 320 in FIG. 3A. At location 320, the light-converting material 316 forms a top layer, which may be a layer of phosphor that converts the color of the light emitted by the light-emitting diode 202. The light-emitting diode 202 is provided on top of the ceramic substrate 310.

The ceramic substrate may include various materials (e.g., silicon, aluminum nitride, and/or aluminum oxide) that may increase thermal conductivity and/or decrease electrical conductivity of the ceramic substrate 310. Increasing thermal conductivity of the ceramic substrate 310 may increase heat transfer away from the light-emitting diode 202, thereby improving the performance of the light-emitting diode 202. Decreasing electrical conductivity of the ceramic substrate 310 may decrease power loss, thereby improving power efficiency of the light-emitting device 102.

The ceramic substrate 310 may also include a reflective component (e.g., zirconium oxide), which may be infused throughout the ceramic substrate 310. The reflective component may increase the reflectivity of the ceramic substrate 310, which consequently decreases self-absorption, increases conversion efficiency, and increases overall light output. The die attach material 312 may secure the ceramic substrate 310 to the aluminum carrier 314.

One of ordinary skill in the art will appreciate that any description provided with respect to the light-emitting device 102 may also apply to any lighting system, any light-emitting apparatus, and/or any other apparatus that emits light.

Figure 4A:
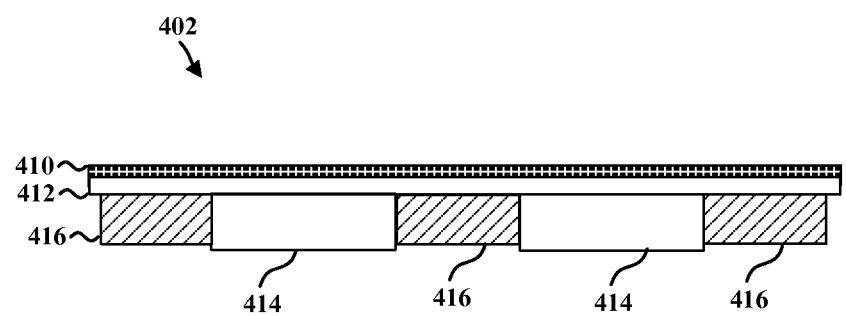
FIG. 4A is a side view illustration of an exemplary embodiment of a light-emitting device with electrodes using an encapsulant.

FIG. 4A is a side view illustration of an exemplary embodiment of the light-emitting device 402. Light emitting device 402 includes light emitting layers 410, contact layers 412, electrodes 414 (two shown), and encapsulant 416. Light emitting layers 410 can include gallium nitride (GaN) containing layers and/or aluminum indium gallium phosphide (AlInGaP) containing layers, that are fabricated on sapphire, silicon (Si), silicon carbide (SiC), gallium arsenide (GaAs), indium phosphide (InP), gallium phosphide (GaP), gallium nitride (GaN), ceramic, or other suitable substrate. Light emitting layers 410 can be fabricated by epitaxially growing the layers on the substrate using Metal-Organic Chemical Vapor Deposition (MOCVD). Contact layers 412 can include p and n contact layers. The p contact layer can include materials such aluminum based or silver based materials having high reflectivity. The n contact layer can include materials such as titanium or aluminum containing alloys. The p and n contact layers are electrically isolated from each other and electrically coupled to the electrodes 414. The p and n contact layers, which are disposed within contact layer 412, can be electrically isolated from each other via a dielectric material disposed between them. P and n contact layers can be formed using a buried contact architecture as is understood by those skilled in the art. Electrodes 414 are used to make electrical contacts from external leads or conductors (not shown) to the contact layers 412 which are electrically coupled to the light emitting layers 410. Electrodes 414 can be formed from copper, nickel, chrome, chromium or combinations thereof.

Encapsulant 416 can be used to encapsulate and surround electrodes 414 on at least one side. Encapsulant 416 can also provide support to the entire LED device 402 so that LED device 402 is more stable, rigid and does not deform during processing or handling. Encapsulant 416 is a transparent encapsulant that can be formed from a silicone based material. Transparent encapsulant 416 can be cured to become solid. Alternatively, transparent encapsulant 416 can be fabricated using spin-on dielectric materials or spin-on glass materials, which can also be subsequently cured to make solid. In another alternate embodiment, transparent encapsulant 416 is formed using compression molding, transfer molding or injection molding techniques.

During operation, a portion of the light emitted by light emitting layers 410 is scattered by surrounding packaging components used to package the LED device 402. The transparent encapsulant permits the scattered light to pass through with minimal absorption. By using transparent encapsulant 416, the efficiency of a packaged LED device is significantly improved because light is not absorbed by the transparent encapsulant material. For example, in a multi-chip package using transparent encapsulant 416 the efficiency can be between 5% and 10% greater than in a multi-chip package using non-transparent encapsulant.

Figure 4B:
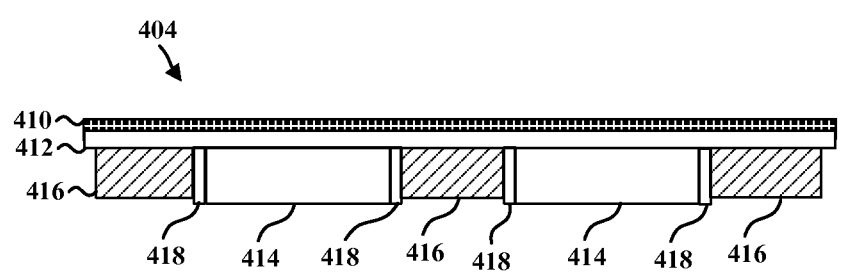
FIG. 4B is a side view illustration of another exemplary embodiment of a light-emitting device with electrodes using a transparent encapsulant and a reflective layer on the electrodes.

FIG. 4B is a side view illustration of an exemplary embodiment of the light-emitting device 404. Light emitting device 404 includes light emitting layers 410, contact layers 412, electrodes 414 (two shown), encapsulant 416 and reflective layers 418. Light emitting layers 410 can include gallium nitride (GaN) containing layers and/or aluminum indium gallium phosphide (AlInGaP) containing layers, that are fabricated on sapphire, silicon (Si), silicon carbide (SiC), gallium arsenide (GaAs), indium phosphide (InP), gallium phosphide (GaP), gallium nitride (GaN), ceramic, or other suitable substrate. Light emitting layers 410 can be fabricated by epitaxially growing the layers on the substrate using MOCVD. Contact layers 412 can include p and n contact layers. The p contact layer can include materials such aluminum based or silver based materials having high reflectivity. The n contact layer can include materials such as titanium or aluminum containing alloys. The p and n contact layers are electrically isolated from each other and electrically coupled to the electrodes 414. The p and n contact layers, which are disposed within contact layer 412, can be electrically isolated from each other via a dielectric material disposed between them. P and n contact layers can be formed using a buried contact architecture as is understood by those skilled in the art. Electrodes 414 are used to make electrical contacts from external leads or conductors (not shown) to the contact layers 412 which are electrically coupled to the light emitting layers 410. Electrodes 414 can be formed from copper, nickel, chrome, chromium or combinations thereof. Reflective layers 418 surround the electrodes 414 and are used to reflect light from the electrode 414.

Encapsulant 416 can be used to encapsulate and surround electrodes 414 and reflective layers 418 on at least one side. Encapsulant 416 can also provide support to the entire LED device 404 so that LED device 404 is more stable, rigid and does not deform during processing or handling. Encapsulant 416 is a transparent encapsulant that can be formed from a silicone based material. Transparent encapsulant 416 can be cured to become solid. Alternatively, transparent encapsulant 416 can be fabricated using spin-on dielectric materials or spin-on glass materials, which can also be subsequently cured to make solid. In another alternate embodiment, transparent encapsulant 416 is formed using compression molding, transfer molding or injection molding techniques.

Reflective layers 418 are used to enhance the efficiency of the packaged LED by reflecting scattered light from the electrodes 414, which would otherwise be partially absorbed by the electrodes 414. Reflective layer is fabricated from aluminum based, titanium oxide or other white or reflective materials. The reflective layer is fabricated on the walls of the electrodes by plating, sputtering, spraying etc. During operation, a portion of the light emitted by light emitting layers 410 is scattered by surrounding packaging components used to package the LED device 404. The transparent encapsulant 416 permits the scattered light to pass through with minimal absorption. The reflective layer 418, which is formed on the electrodes 414, reflects light from electrodes 414 so that electrodes 414 do not absorb the light passing through the encapsulant. Reflective layers 418 enhance the efficiency of the packaged LED device 404. In some embodiments, the efficiency of a packaged LED device 404, which includes both transparent encapsulant 416 and a reflective layer 418 on the electrodes 414, is significantly improved. For example, in a multi-chip package using transparent encapsulant 416 and a reflective layer 418 on the electrodes 414, the efficiency can be greater than 5% to 10% than in a multi-chip package using non-transparent encapsulant.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. A light-emitting device, comprising:
   a ceramic substrate comprising a first material and a reflective material infused throughout the ceramic substrate in the first material, wherein the first material is one of aluminum oxide ($Al_2O_3$), aluminum nitride (AlN), and silicon (Si);
   an aluminum carrier having an aluminum surface and a die attach material,
      wherein the die attach material secures the ceramic substrate directly to the aluminum carrier;
   a light-emitting diode on the ceramic substrate configured to receive power from a power source;

a plurality of parallel light-converting material layers configured to surround three sides of the light-emitting diode; and an electrical insulator disposed above the ceramic substrate separate from the plurality of parallel light-converting material layers, the electrical insulator configured to electrically insulate the power source from the ceramic substrate and the aluminum carrier;

wherein the power source is disposed directly on and above the electrical insulator, with the ceramic substrate being below and on an opposite side of the electrical insulator with an intervening bonding pad; and wherein the ceramic substrate is secured directly to the aluminum carrier via the die attach material and without an additional separate intervening electrical insulator.

2. The light-emitting device of claim 1, wherein the reflective material comprises zirconium oxide ($ZrO_2$).

3. The light-emitting device of claim 1, wherein a percent reflectivity of the ceramic substrate is at least 70%.

4. The light-emitting device of claim 1, wherein the ceramic substrate provides at least some electrical insulation between the light-emitting diode and the aluminum carrier.

5. The light-emitting device of claim 1, wherein the ceramic substrate provides at least some thermal conductivity between the light-emitting diode and the aluminum carrier.

6. The light-emitting device of claim 1, wherein the plurality of parallel light-converting material layers comprises phosphor.

7. The light-emitting device of claim 1, wherein the first material is aluminum oxide ($Al_2O_3$).

8. The light-emitting device of claim 1, wherein the first material is aluminum nitride (AlN).

9. The light-emitting device of claim 1, wherein the first material is silicon (Si).

10. A lighting system, comprising:
   a ceramic substrate comprising a first material and a reflective material infused throughout the ceramic substrate in the first material, wherein the first material is one of aluminum oxide ($Al_2O_3$), aluminum nitride (AlN), and silicon (Si);
   an aluminum carrier and a die attach material, wherein the die attach material secures the ceramic substrate directly to the aluminum carrier;
   a plurality of light-emitting diodes connected together in series, wherein the plurality of light-emitting diodes are on the ceramic substrate and configured to receive power from a power source;
   a plurality of parallel light-converting material layers configured to surround three sides of the plurality of light-emitting diodes; and
   an electrical insulator disposed above the ceramic substrate separate from the plurality of parallel light-converting material layers, the electrical insulator configured to electrically insulate the power source from the ceramic substrate and the aluminum carrier;
   wherein the power source is disposed directly on and above the electrical insulator, and the ceramic substrate is below and on an opposite side of the electrical insulator with an intervening bonding pad; and
   wherein the ceramic substrate is secured directly to the aluminum carrier via the die attach material and without an additional separate intervening electrical insulator.

11. The lighting system of claim 10, wherein the reflective material comprises zirconium oxide ($ZrO_2$).

12. The lighting system of claim 10, wherein a percent reflectivity of the ceramic substrate is at least 70%.

13. The lighting system of claim 10, wherein the ceramic substrate provides at least some electrical insulation between at least one of the plurality of light-emitting diodes and the aluminum carrier.

14. The lighting system of claim 10, wherein the ceramic substrate provides at least some thermal conductivity between at least one of the plurality of light-emitting diodes and the aluminum carrier.

15. The lighting system of claim 10, wherein the plurality of parallel light-converting material layers comprises phosphor.

16. The lighting system of claim 10, wherein the first material is aluminum oxide ($Al_2O_3$).

17. The lighting system of claim 10, wherein the first material is aluminum nitride (AlN).

18. The lighting system of claim 10, wherein the first material is silicon (Si).

* * * * *